(12) United States Patent
Zhao et al.

(10) Patent No.: US 12,736,463 B2
(45) Date of Patent: Sep. 15, 2026

(54) BACKGROUND REDUCTION METHOD FOR SOIL XRF SPECTRUM BASED ON XRF-EGAN MODEL

(71) Applicant: Yangtze Delta Region Institute (Huzhou), University of Electronic Science and Technology of China, Huzhou City (CN)

(72) Inventors: Yanchun Zhao, Huzhou City (CN); Xinghua He, Huzhou City (CN); Huanlong Zhang, Huzhou City (CN); Fusheng Li, Huzhou City (CN); Xinran Wang, Huzhou City (CN)

(73) Assignee: Yangtze Delta Region Institute (Huzhou), University of Electronic Science and Technology of China, Huzhou City (CN)

( * ) Notice: Subject to any disclaimer, the term of this patent is extended or adjusted under 35 U.S.C. 154(b) by 967 days.

(21) Appl. No.: 17/993,450

(22) Filed: Nov. 23, 2022

(65) Prior Publication Data

US 2023/0366810 A1 Nov. 16, 2023

(30) Foreign Application Priority Data

May 13, 2022 (CN) ........................ 202210523696.0

(51) Int. Cl.

| | |
|---|---|
| ***G01N 21/25*** | (2006.01) |
| ***G01N 23/223*** | (2006.01) |
| ***G06F 30/27*** | (2020.01) |

(52) U.S. Cl.
CPC ......... *G01N 21/255* (2013.01); *G01N 23/223* (2013.01); *G06F 30/27* (2020.01)

(58) Field of Classification Search
None
See application file for complete search history.

(56) References Cited

U.S. PATENT DOCUMENTS

| | | | | |
|---|---|---|---|---|
| 5,599,372 A * | 2/1997 | Pommier | .............. | C22B 3/1625 588/407 |
| 6,765,986 B2 * | 7/2004 | Grodzins | ............. | G01N 23/223 378/45 |
| 7,016,462 B1 * | 3/2006 | Keville | ................ | G01N 23/223 378/45 |
| 7,200,200 B2 * | 4/2007 | Laurila | ................ | G01N 23/223 378/45 |

(Continued)

*Primary Examiner* — Maikhanh Nguyen

(74) *Attorney, Agent, or Firm* — Daniel A. Blasiole; DeWitt LLP

(57) ABSTRACT

The present application relates to the field of XRF spectra analysis, and discloses a background reduction method for soil XRF spectra based on the XRF-EGAN, which is based on the design mode of GAN model, includes constructing a generator of the model by using a one-dimensional fully convolutional network layer and a residual connection, constructing a discriminator of the model by using one-dimensional convolution and a fully connected layer, and training the XRF-EGAN model by using an adversarial training mode, and then obtaining the trained generator and discriminator, and the generator is a soil XRF background reduction model, which in turn improves the correlation between the net peak area and the content of element of soil XRF, and thus enhances the accuracy of quantitative analysis of element based on XRF spectra.

6 Claims, 4 Drawing Sheets

(56) References Cited

U.S. PATENT DOCUMENTS 12,339,240 B2 * 6/2025 Huang ..................... G05D 1/46
2004/0240606 A1 * 12/2004 Laurila ................ G01N 23/223 378/45
2006/0140725 A1 * 6/2006 Benjamin ................. B09C 1/02 405/128.7
2010/0040281 A1 * 2/2010 Chen ...................... G06N 3/006 340/853.2
2013/0170613 A1 * 7/2013 Utaka .................. G01N 23/223 378/46
2019/0351804 A1 * 11/2019 Kanck ....................... B60P 3/14
2022/0365007 A1 * 11/2022 Huang ..................... G05D 1/46

* cited by examiner

BACKGROUND REDUCTION METHOD FOR SOIL XRF SPECTRUM BASED ON XRF-EGAN MODEL

CROSS-REFERENCE TO RELATED APPLICATION

A claim for priority to the May 13, 2022 filing date of CN Patent Application No. CN 202210523696.0 ("the '696.0 Chinese Application"), is hereby made pursuant to 35 U.S.C. § 119(a). The entire disclosure of the '696.0 Chinese Application is hereby incorporated herein.

TECHNICAL FIELD

The present application relates to the field of XRF spectra background reduction, and more particularly, to a background reduction method for XRF spectra based on a XRF-EGAN deep network model.

BACKGROUND

There are various types of background reduction methods for soil XRF spectra, such as wavelet transform, Fourier transform, peak-shaving method, polynomial fitting, etc. In practical applications, before using soil XRF spectroscopy for quantitative analysis of elemental content contained in soil, background reduction methods are needed to perform baseline calibration of the background noise of XRF spectrum to make the elemental content analysis more accurate. The accuracy of the traditional background reduction method in the baseline calibration of soil XRF spectra still needs to be improved, and the robustness and self-adaptability of the traditional method are weak. The development of deep neural network technology and the features of convolutional neural network such as strong robustness and self-adaptive ability provide a new implementation method for soil XRF spectra background reduction.

Generative adversarial neural network (GAN) is a neural network model that learns by adversarial training, compared with other neural network structures. GAN has several advantages: (1) GAN model consists of generator and discriminator, and the generator and discriminator can be composed of different network layers, which has high flexibility; (2) GAN adopts adversarial training learning, the generator of GAN model is responsible for generating samples or denoising the input samples, and the discriminator is responsible for helping the generator to complete the adversarial training of the model. Because GAN network models have these advantages, they are widely studied in the fields of image generation and denoising, speech denoising, and so on. The present application mainly focuses on: how to design a more accurate XRF background reduction network model using GAN model, to provide a soil XRF spectrum background reduction method with robustness and self-adaptive capability, to improve the accuracy of soil XRF spectra background reduction, and then to improve the correlation between the XRF characteristic peak area and content of element, so that the XRF data processed by this method can be analyzed more accurately for the content of element.

SUMMARY

The technical problem to be addressed in the present application is: how to provide a background reduction method for soil XRF based on XRF-EGAN neural network model to improve the correlation between the net peak area and the content of element of soil XRF spectrum.

To achieve the above purpose, the technical solutions used in the present application are:

A background reduction method for soil XRF based on a XRF-EGAN model, which includes: constructing a generator of a model by using a one-dimensional fully convolutional network layer and a residual connection, based on a design mode of a GAN model, constructing a discriminator of the model by using one-dimensional convolution and a fully connected layer, and obtaining a trained generator and a trained discriminator by training the XRF-EGAN model using an adversarial training mode. The generator is a soil XRF background reduction model, which improves a correlation between a net peak area and content of element of soil XRF.

Further, a trained optimized generator is obtained by adversarial training of the XRF-EGAN model, and the trained optimized generator is used in a soil XRF spectra background reduction task, wherein, the XRF-EGAN model is applied to soil XRF spectra, and is further applied to XRF spectra data of alloy XRF spectra, spectrum alloy XRF spectra obtained by using an XRF analyzer.

Further, the background reduction method for soil XRF based on the XRF-EGAN model of claim 1 includes:

step 1: collecting XRF spectra data of a soil sample by using an XRF analyzer, and manually reducting the background of the XRF spectra data of the soil sample to finally obtain the soil XRF spectra data $Data_{noisy}$ before background reduction and the soil XRF spectra data $Data_{clean}$ without the background;

step 2: training the XRF-EGAN neural network model via the collected $Data_{noisy}$ data and $Data_{clean}$ data, and saving network model parameters of the generator of an optimal XRF-EGAN model after completing the training;

step 3: loading the network model of the generator of the XRF-EGAN model, performing XRF spectra background reduction by using the network of the generator of the XRF-EGAN model for new soil XRF spectra data measured by the XRF analyzer, and obtaining an output after the background reduction.

Further, a loss function used for training the generator of the XRF-EGAN neural network model in step 2 is as follows:

$$\min_G V(G) = \frac{1}{2} E_{x \square p_{data}(x_c), z \square p_z(z)}\left[(D(G(z,x)) - 1)^2\right] + \lambda \|G(z,x) - x_c\|_1$$

where $z \in R^{1\times1024}$ □ denotes noise obeying standard normal distribution; x denotes input XRF spectra data containing the background; G denotes the generator; G(z,x) denotes an output obtained by inputting z and x into the generator, i.e., an output result of XRF background reduction; D denotes the discriminator; $(D(G(z,x))-1)^2$ □ denotes a mean square error of an output of the discriminator with respect to 1; $x_c$ denotes XRF spectra data without the background; $\| \|_1$ denotes L1 norm; λ denotes a coefficient of L1 norm.

Further, the discriminator of the XRF-EGAN neural network model in step 2 is trained by using a loss function as follows:

$$\min_D V(D) = \frac{1}{2}E_{x \sim p_{data}(x,x_c)}\left[(D(x, x_c) - 1)^2\right] + \frac{1}{2}E_{x \sim p_{data}(x_c), z \sim p_z(z)}\left[D(G(z, x), x)^2\right]$$

where $z \in R^{1\times1024}$ denotes noise obeying standard normal distribution; x denotes input XRF spectra data containing the background; G denotes the generator; G(z,x) denotes an output obtained by inputting z and x into the generator, i.e., an output result of XRF background reduction; D denotes the discriminator; $D(G(z, x))^2$ denotes a mean square error of an output of the discriminator with respect to 1; $x_c$ denotes XRF spectra data without the background; $\| \|_1$ denotes L1 norm; λ denotes a coefficient of L1 norm.

Further, a forward propagation process of the XRF-EGAN neural network model in step 2 is to input the soil XRF spectra data x containing the background into the model of the generator, and after a series of one-dimensional convolution operations and residual concatenations, the input soil XRF spectra data x is feature-compression encoded and decoded, and a background reduction result $\hat{x}$ with a same dimension as the input soil XRF spectra data x is finally obtained; the background reduction result z from the generator is input to the discriminator together with the XRF spectra data $x_c$ without the background corresponding to the input soil XRF spectra data x, and an output $o \in R^{1\times2}$ of the discriminator □ is finally obtained, and a corresponding loss value is calculated according to the loss function to optimize the models of the generator and discriminator of the XRF-EGAN.

Further, before inputting soil XRF spectra data x with background into the XRF-EGAN neural network model in step 2, preprocessing the soil XRF spectra data x, and an expression for preprocessing the soil XRF spectra data x is as follows:

$$y_i = \begin{cases} \log_2^{x_i}, x_i \geq 1 \\ 0, x < 1 \end{cases}, x_i \in R, i = 1, 2, \ldots, 2048$$

where $x_i$ denotes a count value of the i-th channel of 2048 channels of the XRF spectra, logarithm of the input soil XRF spectra data x is taken, and then a logarithmically taken result $y=[y_1\ y_2 \ldots y_{2048}]$ is maximum-value and minimum-value normalized, and a mathematical expression is as follows:

$$z_i = \frac{y_i}{\max(y) - \min(y)}, i = 1, 2, \ldots, 2048$$

where y denotes an output result of the input soil XRF spectra data x after taking the logarithm; $z_i$ denotes a normalized result of a result $y_i$ of the i-th channel after taking the logarithm.

Further, the generator of the XRF-EGAN model in step 3 is configured to perform background reduction of the input soil XRF spectra data x and an output result is subjected to an inverse normalization operation with the following expression:

$$\bar{y} = G(x) \times (\max(y) - \min(y))$$

where y denotes an output result of the input soil XRF spectra data x after taking the logarithm; G(x) denotes an output result of the input soil XRF spectra data x through the generator of the XRF-EGAN model; $\bar{y}$ denotes an inverse normalization result, and after completing the inverse normalization, the inverse normalization result $\bar{y}$ is then exponentiated by the following equation:

$$\bar{x_i} = e^{\bar{y}_i}, i = 1, 2, \ldots, 2048$$

where $\bar{y}_i$ denotes the inverse normalization result of the i-th value of an output matrix of the generative model G; $\bar{x}_i$ denotes the result of exponentiating the $\bar{y}_i$.

The beneficial effects of the present application are that: the present application provides a new background reduction method for soil XRF spectra—a background reduction method for soil XRF spectra based on XRF-EGAN, which includes using the XRF-EGAN generative adversarial network model composed of a generator and a discriminator to model the background reduction for soil XRF spectra, and through the adversarial training, the XRF-EGAN model is trained to achieve the background reduction for soil XRF spectra, and the generator in the trained XRF-EGAN model is used to achieve the background reduction for soil XRF spectra, and finally the correlation between the net peak area and the content of element of soil XRF spectra is improved. In addition, the present application applies the background reduction method for soil XRF spectra based on the XRF-EGAN to improve the correlation between the net peak area of copper (Cu) element and the content of Cu element in soil XRF spectra, and the method can effectively improve the correlation between the net peak area of copper (Cu) element and the content of Cu element in soil XRF spectra.

DETAILED DESCRIPTION

Figure 1:
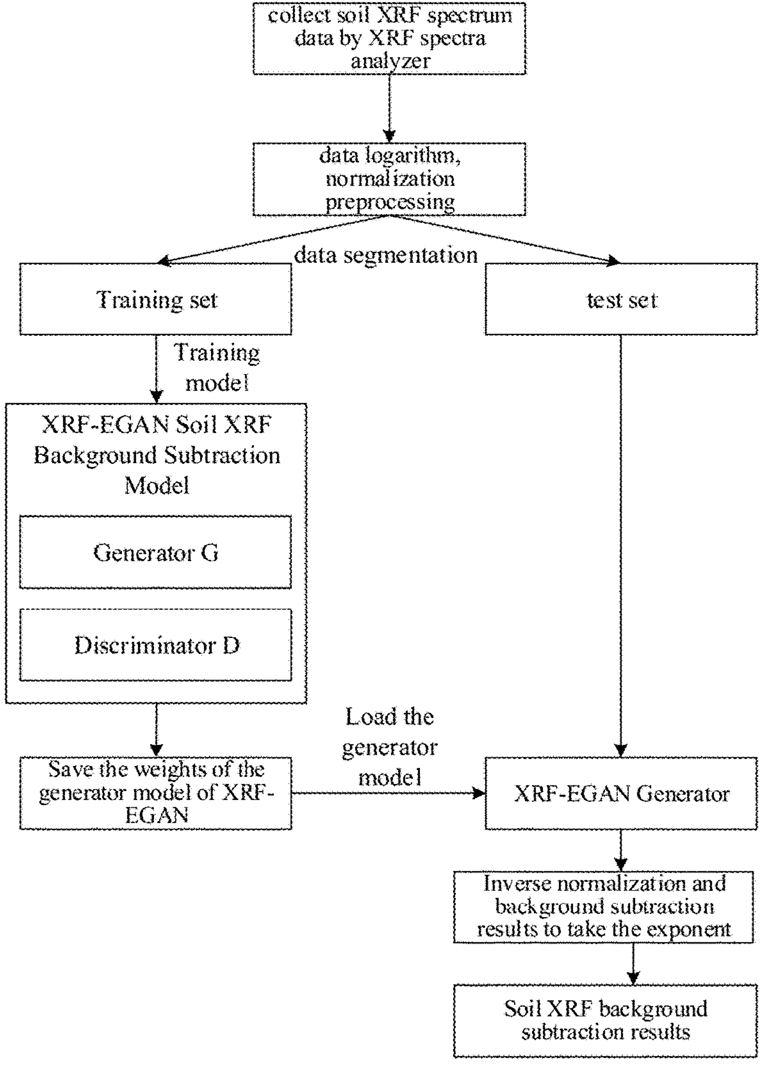
FIG. 1 is an operating flowchart of a background reduction method for soil XRF spectrum based on the XRF-EGAN according to the present application.

The present application provides a new background reduction method for soil XRF based on the XRF-EGAN neural network model, which is used to achieve background reduction for soil XRF spectra and improve the correlation between the net peak area and the content of element of soil XRF spectrum. The XRF-EGAN background reduction network model is trained by using soil XRF spectra data, and the scheme is analyzed and validated using test datasets. The XRF-EGAN network model is a XRF background reduction model built based on the GAN model, which is different from the traditional XRF background reduction method, and has strong robustness and self-adaptive capability, through the adversarial training learning of the generator and the discriminator, the generator of XRF-EGAN model can learn the background-free XRF spectrum after the background reduction of soil XRF spectrum data, and effectively improve the correlation between the net peak area and the content of element of soil XRF spectrum. Therefore, the present application can realize the background reduction of soil XRF spectrum through the XRF-EGAN model, so as to effectively improve the correlation between the net peak area of copper (Cu) element and the content of copper (Cu) element in soil XRF spectrum. Based on the above concepts, the embodiment provides a background reduction method for soil XRF spectrum based on the XRF-EGAN model to improve the correlation between the net peak area of copper (Cu) element and the content of Cu element in soil XRF spectra, and the operating flowchart is shown in FIG. 1, and the steps are as follows.

Step 1: collecting soil XRF spectrum data by XRF spectra analyzer and manually subtract the background of XRF spectrum of each soil sample to finally obtain soil samples with background x and soil samples without background $x_c$;

Step 2: dividing the dataset $(x, x_c)$ into a training dataset $$(x^{train}, x_c^{train})$$

and a test dataset $$(x^{test}, x_c^{test});$$

Figure 2:
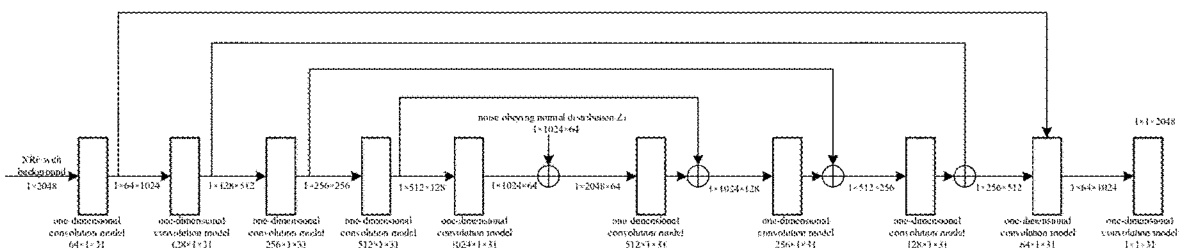
FIG. 2 is a diagram of the XRF-EGAN model.
Figure 3:
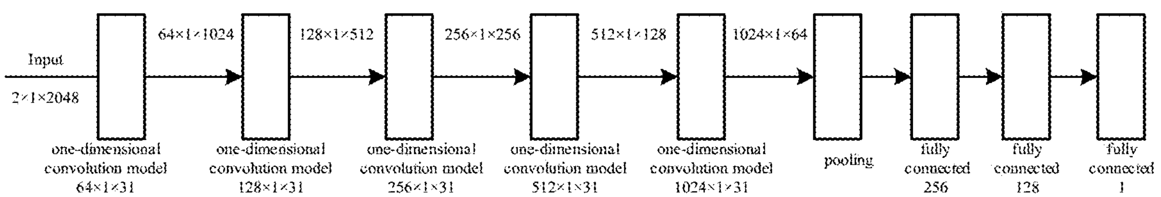
FIG. 3 is a structural schematic diagram of the model of the XRF-EGAN generator.
Figure 4:
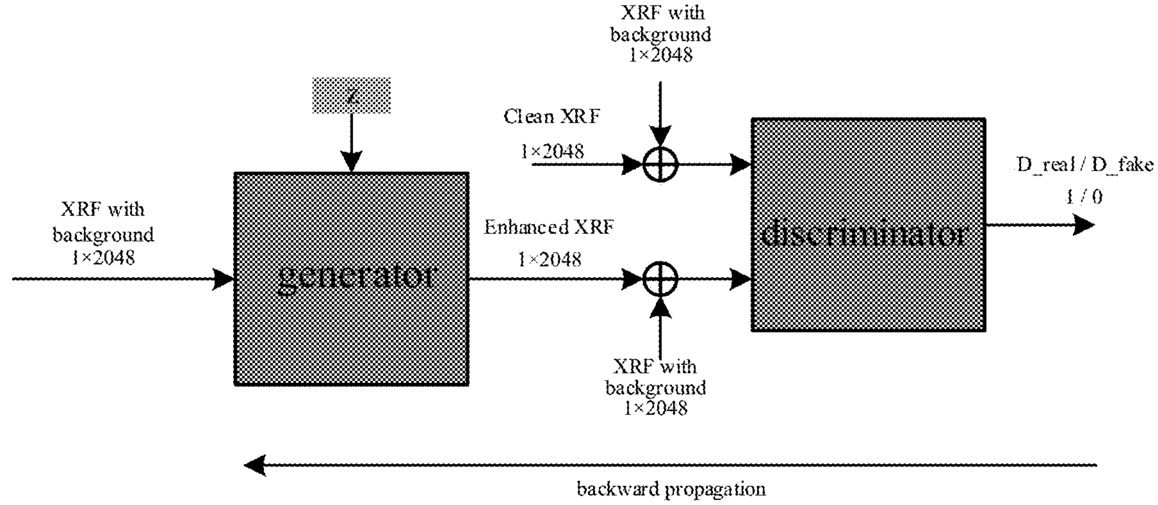
FIG. 4 is a structural schematic diagram of the XRF-EGAN discriminator model.

Step 3: training the XRF-EGAN network model using the training dataset $(x, x_c)$, the structure of the XRF-EGAN network is shown in FIG. 2, FIG. 3 and FIG. 4, obtaining the final trained XRF spectra background reduction model XRF-EGAN;

Step 4: performing background reduction for each XRF spectrum sample in the test dataset $$(x^{test}, x_c^{test})$$

using the generator G of the trained XRF-EGAN background reduction model, and obtaining the background reduction results of XRF spectrums for all test samples.

Step 5: analyzing the correlation between the principal component and the content of the specified elements by using the XRF spectrum of soil samples with background reduction through the XRF-EGAN model, and obtaining the correlation results.

The following is a further explanation of the embodiment in conjunction with a specific example—the correlation analysis of the principal component and content of soil Cu element based on the XRF-EGAN model. The experimental data are shown in Table 1 below.

TABLE 1

Number of soil XRF spectrum collected in the embodiment

| Soil Data | Training set | Test set |
|---|---|---|
| Number of samples (pcs) | 73 | 59 |

For the experiments, the training environment used is NVDIA 1050Ti graphics card under Windows environment, and the number of training iterations of XRF-EGAN model is 100 iterations.

Figure 5:
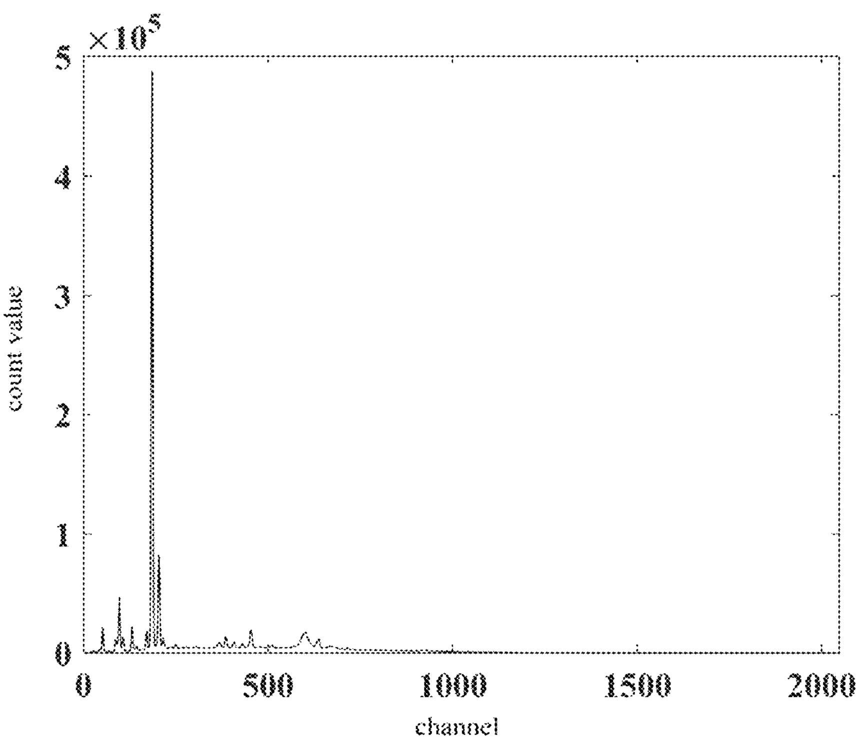
FIG. 5 is a sample diagram of the soil XRF spectra data according to an embodiment.

Step 1: collecting 132 soil XRF spectra data by XRF analyzer x, and dividing the collected data set into training data set $x^{train}$ and test data set $x^{test}$, where the training data set is taken as 73 and the test data set as 59. The soil spectra data used in the experiment are shown in FIG. 5. For all the soil XRF spectra data in the training data set $x^{train}$, the background of all soil XRF samples are reduced manually to obtain the XRF spectrum data $$x_c^{train}$$

without the background.

Step 2: constructing the XRF-EGAN soil XRF background reduction model and training the XRF-EGAN neural network model using the XRF spectrum data with background noise from the training dataset $x^{train}$ and the clean XRF spectrum data $$x_c^{train}$$

after manual background reduction, and obtaining the trained XRF-EGAN soil XRF background reduction model.

Figure 6:
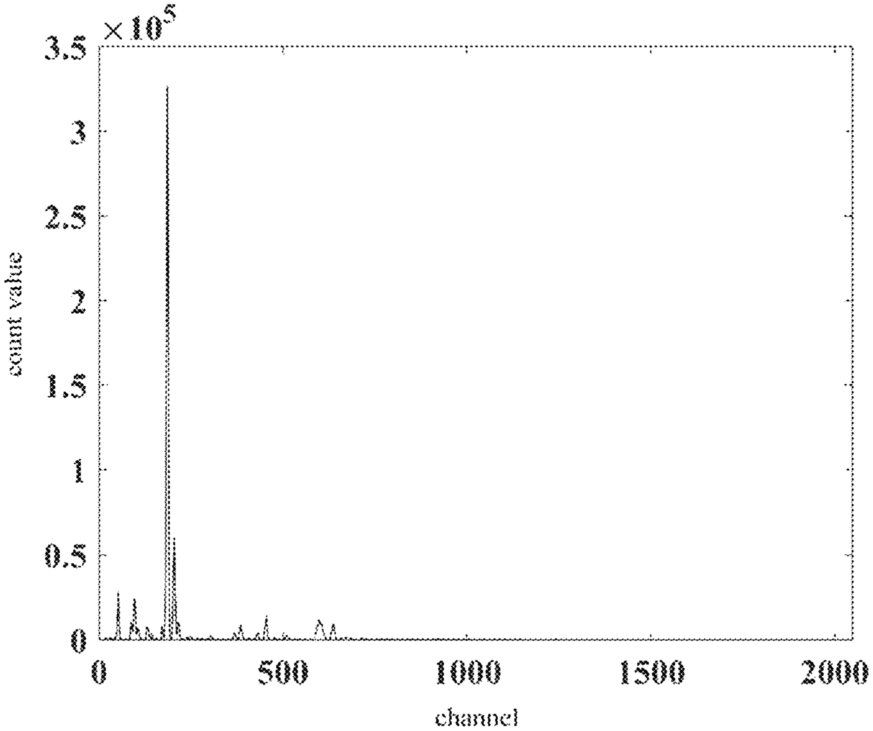
FIG. 6 is a schematic diagram shows the result of the soil XRF spectra data after the background reduction through the XRF-EGAN according to an embodiment.

Step 3: evaluating and validating the XRF-EGAN soil XRF background reduction model by the test dataset $x^{test}$. Inputting each sample of the test dataset to the XRF-EGAN model, and performing the background reduction of the input soil XRF spectra by the generator, and finally obtaining the XRF spectra data after background reduction of all the test samples, and the results of the experiment using the XRF-EGAN model for the background reduction of soil XRF spectra are shown in FIG. 6.

Step 4: obtaining the net peak area of the Cu element corresponding to the soil XRF spectra after the background reduction, and analyzing the correlation between the net peak area of Cu element and the content of Cu element.

Figure 7:
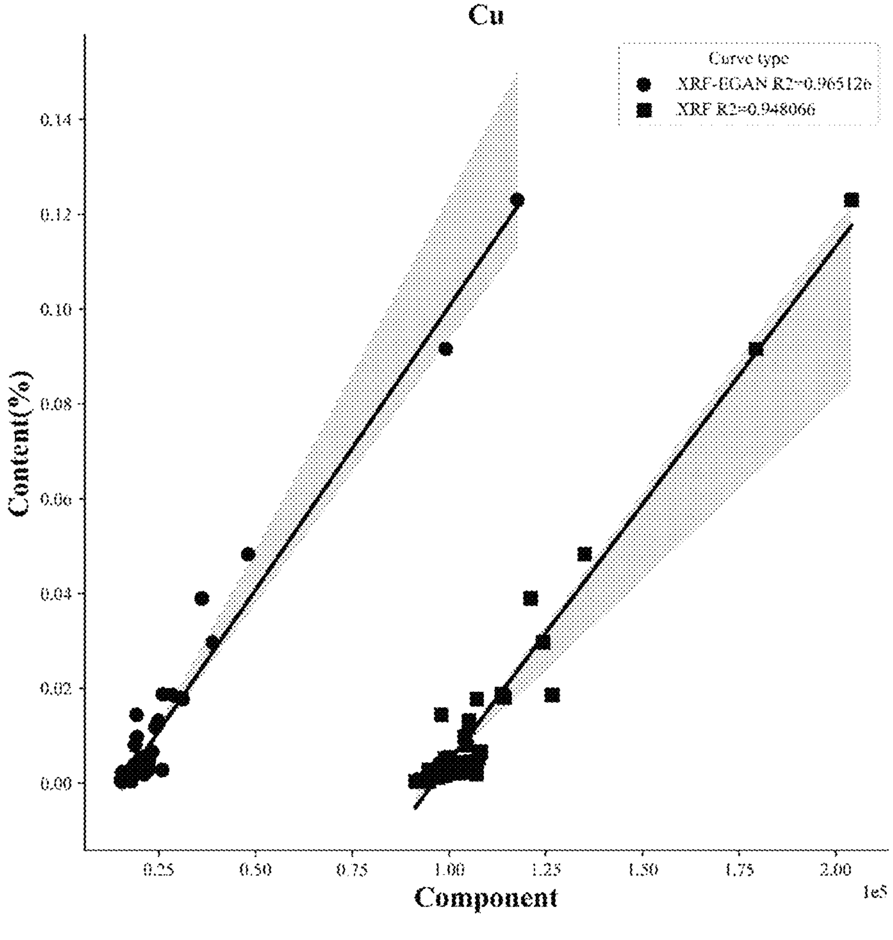
FIG. 7 is a schematic diagram shows the correlation result of the CU element before the background reduction and after the background reduction through the XRF-EGAN.

Through the above steps, the final results of the correlation between the principal component and content of Cu element after the background reduction of soil XRF based on the XRF-EGAN model are obtained, as shown in FIG. 7. From FIG. 7, it can be seen that the correlation between the principal component and content of Cu element is improved by using the XRF-EGAN model to realize the background reduction of soil XRF spectrum. Meanwhile, compared with the soil XRF spectrum without background reduction, the comparison results are shown in Table 2.

TABLE 2

Correlation between the net peak area of soil Cu element and the content of Cu element

| Method | $R^2$ of net peak area and content of element Cu |
|---|---|
| Without background reduction | 0.948066 |
| XRF-EGAN | 0.965126 |

Therefore, it can be determined that the background reduction of soil XRF spectra using the XRF-EGAN neural network model can effectively improve the correlation between the net peak area and content of XRF spectra of Cu element, and the results are consistent with the experimental scheme, thereby proving the effectiveness of the embodiment.

The invention claimed is:

1. A background reduction method for soil XRF based on an XRF-EGAN model, the background reduction method for soil XRF comprises:

constructing a generator of a model by using a one-dimensional fully convolutional network layer and a residual connection, based on a design mode of a GAN model, constructing a discriminator of the model by using one-dimensional convolution and a fully connected layer, and obtaining a trained generator and a trained discriminator by training the XRF-EGAN model using an adversarial training mode, wherein, the generator is a soil XRF background reduction model, which in turn improves a correlation between a net peak area and content of element of soil XRF, wherein, XRF denotes X-ray Fluorescence, and the XRF-EGAN model denotes an XRF background reduction model built based on a Generative Adversarial Neural Network (GAN) model;

and wherein the background reduction method for soil XRF comprises:

step 1: collecting XRF spectra data of a soil sample by using an XRF analyzer, and manually subtracting the background of the XRF spectra data of the soil sample to finally obtain the soil XRF spectra data $Data_{noisy}$ before background reduction and the soil XRF spectra data $Data_{clean}$ without the background;

step 2: training the XRF-EGAN neural network model via the collected $Data_{noisy}$ data and $Data_{clean}$ data, and saving network model parameters of the generator of an optimal XRF-EGAN model after completing the training;

step 3: loading the network model of the generator of the XRF-EGAN model, performing XRF spectra background reduction by using the network of the generator of the XRF-EGAN model for new soil XRF spectra data measured by the XRF analyzer, and obtaining an output after the background reduction;

wherein, before inputting soil XRF spectra data x with background into the XRF-EGAN neural network model in step 2, preprocessing the soil XRF spectra data x, and an expression for preprocessing the soil XRF spectra data x is as follows:

$$y_i = \begin{cases} \log_2^{x_i}, x_i \geq 1 \\ 0, x < 1 \end{cases}, x_i \in R, i = 1, 2, \ldots, 2048$$

where $x_i$ denotes a count value of the i-th channel of 2048 channels of the XRF spectra, logarithm of the input soil XRF spectra data x is taken, and then a logarithmically taken result $y=[y_1\ y_2 \ldots y_{2048}]$ is maximum-value and minimum-value normalized, and a mathematical expression is as follows:

$$z_i = \frac{y_i}{\max(y) - \min(y)}, i = 1, 2, \ldots, 2048$$

where y denotes an output result of the input soil XRF spectra data x after taking the logarithm; $z_i$ denotes a normalized result of a result $y_i$ of the i-th channel after taking the logarithm.

2. The background reduction method for soil XRF based on the XRF-EGAN model of claim 1, wherein a trained optimized generator is obtained by adversarial training of the XRF-EGAN model, and the trained optimized generator is used in a soil XRF spectra background reduction task, wherein, the XRF-EGAN model is applied to soil XRF spectra, and is further applied to XRF spectra data of alloy XRF spectra, spectrum alloy XRF spectra obtained by using an XRF analyzer.

3. The background reduction method for soil XRF based on the XRF-EGAN model of claim 1, a loss function used for training the generator of the XRF-EGAN neural network model in step 2 is as follows:

$$\min_G V(G) = \frac{1}{2} E_{x\sim p_{data}(x_c), z\sim p_z(z)}\left[(D(G(z, x)) - 1)^2\right] + \lambda \| G(z, x) - x_c \|_1$$

where $z \in R^{1\times1024}$ denotes noise obeying standard normal distribution; x denotes input XRF spectra data containing the background; G denotes the generator; G(z,x) denotes an output obtained by inputting z and x into the generator, i.e., an output result of XRF background reduction; D denotes the discriminator; $(D(G(z,x))-1)^2$ denotes a mean square error of an output of the discriminator with respect to 1; $x_c$ denotes XRF spectra data without the background; $\| \|_1$ denotes L1 norm; λ denotes a coefficient of L1 norm.

4. The background reduction method for soil XRF based on the XRF-EGAN model of claim 1, wherein the discriminator of the XRF-EGAN neural network model in step 2 is trained by using a loss function as follows:

$$\min_D V(D) = \frac{1}{2} E_{x\sim p_{data}(x,x_c)}\left[(D(x, x_c) - 1)^2\right] + \frac{1}{2} E_{x\sim p_{data}(x_c), z\sim p_z(z)}\left[D(G(z, x), x)^2\right]$$

where $z \in R^{1\times1024}$ denotes noise obeying standard normal distribution; x denotes input XRF spectra data containing the background; G denotes the generator; G(z,x) denotes an output obtained by inputting z and x into the generator, i.e., an output result of XRF background reduction; D denotes the discriminator; $D(G(z,x))^2$ denotes a mean square error of an output of the discriminator with respect to 0.

5. The background reduction method for soil XRF based on the XRF-EGAN model of claim 1, wherein a forward propagation process of the XRF-EGAN neural network model in step 2 is to input the soil XRF spectra data x containing the background into the model of the generator, and after a series of one-dimensional convolution operations and residual concatenations, the input soil XRF spectra data x is feature-compression encoded and decoded, and a background reduction result $\hat{x}$ with a same dimension as the input soil XRF spectra data x is finally obtained; the background reduction result $\hat{x}$ from the generator is input to the discriminator together with the XRF spectra data x, without the background corresponding to the input soil XRF spectra data x, and an output $o \in R^{1\times 2}$ of the discriminator is finally obtained, and a corresponding loss value is calculated according to the loss function to optimize the models of the generator and discriminator of the XRF-EGAN.

6. The background reduction method for soil XRF based on the XRF-EGAN model of claim 1, wherein the generator of the XRF-EGAN model in step 3 is configured to perform background reduction of the input soil XRF spectra data x and an output result is subjected to an inverse normalization operation with the following expression:

$$\bar{y} = G(x) \times (\max(y) - \min(y))$$

where y denotes an output result of the input soil XRF spectra data x after taking the logarithm; G(x) denotes an output result of the input soil XRF spectra data x through the generator of the XRF-EGAN model; $\bar{y}$ denotes an inverse normalization result, and after completing the inverse normalization, the inverse normalization result $\bar{y}$ is then exponentiated by the following equation:

$$\bar{x}_i = e^{\bar{y}_i}, i = 1, 2, \ldots, 2048$$

where $\bar{y}_i$ denotes the inverse normalization result of the i-th value of an output matrix of the generative model G; $\bar{x}_i$ denotes the result of exponentiating the $\bar{y}_i$.

* * * * *